US006993202B2

(12) United States Patent
Igarashi et al.

(10) Patent No.: US 6,993,202 B2
(45) Date of Patent: Jan. 31, 2006

(54) DECODING APPARATUS, METHOD, AND STORAGE MEDIUM FOR INPUTTING AND DECODING VARIABLE-LENGTH CODED DATA

(75) Inventors: Susumu Igarashi, Kanagawa (JP); Tetsuya Tateno, Kanagawa (JP); Makoto Sato, Tokyo (JP); Yukio Chiba, Kanagawa (JP); Katsumi Otsuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 534 days.

(21) Appl. No.: 10/082,280

(22) Filed: Feb. 26, 2002

(65) Prior Publication Data
US 2002/0164080 A1  Nov. 7, 2002

(30) Foreign Application Priority Data
Feb. 28, 2001  (JP) ............................. 2001-055461

(51) Int. Cl.
*G06K 9/36*  (2006.01)
*G06K 9/46*  (2006.01)
(52) U.S. Cl. ...................................... 382/246; 382/253
(58) Field of Classification Search ................ 382/218, 382/232, 233, 244, 246, 253, 305; 341/65, 341/67; 375/240.01, 240.16, 240.22, 240.23, 375/240.25
See application file for complete search history.

(56) References Cited

U.S. PATENT DOCUMENTS 5,604,498 A * 2/1997 Park ............................ 341/65
5,751,233 A   5/1998 Tateno et al. .................. 341/67
5,793,897 A * 8/1998 Jo et al. ....................... 382/246
5,828,421 A * 10/1998 Boyce et al. ................. 348/565
5,848,194 A   12/1998 Ishizuka et al. .............. 382/234
6,298,087 B1 * 10/2001 Luna et al. ............. 375/240.25

(Continued)

FOREIGN PATENT DOCUMENTS

JP          7-35732         4/1995

(Continued)

OTHER PUBLICATIONS

T. Ikeda et al, "Development of the Ultrasonic Degradation Tester for Low Voltage Cables", Transactions of the Institute of Electrical Engineers of Japan, vol. 120-B, No. 11, pp. 1437-1442, 2000.

*Primary Examiner*—Andrew W. Johns
*Assistant Examiner*—Amir Alavi
(74) *Attorney, Agent, or Firm*—Fitzpatrick, Cella, Harper & Scinto

(57) ABSTRACT

A decoding apparatus has: M tables for storing, in correspondence with M types of variable-length code tables, minimum code words or maximum code words of classes of variable-length code words constructing a variable-length code table; a table selector which selects one table from the M tables; N comparators which compare input coded data with the minimum code words or maximum code words outputted from the table selected by the table selector; a switch circuit and a priority encoder which obtain a class number corresponding to an initial code word of the input coded data based on results of comparison by the N comparators; a code length converter which converts the class number into a code length; and an address generator which generates an address to access a memory holding decoded data from the class number and the code length outputted said code length converter. The data outputted from the memory based on the address becomes decoded data of the input coded data.

19 Claims, 13 Drawing Sheets

U.S. PATENT DOCUMENTS

| | | | |
|---|---|---|---|
| 6,313,767 B1 | 11/2001 | Ishizuka et al. | 341/67 |
| 6,411,229 B2 * | 6/2002 | Kobayashi | 341/67 |
| 6,433,709 B1 * | 8/2002 | Oue | 341/67 |
| 6,441,757 B1 * | 8/2002 | Hirano | 341/67 |
| 6,493,385 B1 * | 12/2002 | Sekiguchi et al. | 375/240.03 |
| 6,603,413 B2 * | 8/2003 | Igarashi et al. | 341/67 |
| 6,650,785 B2 * | 11/2003 | Boon | 382/246 |
| 6,744,928 B1 * | 6/2004 | Juri et al. | 382/246 |
| 2002/0122599 A1 | 9/2002 | Igarashi et al. | 382/239 |

FOREIGN PATENT DOCUMENTS

| | | |
|---|---|---|
| JP | 7-245869 | 9/1995 |
| JP | 9-222393 | 8/1997 |
| JP | 10-19856 | 1/1998 |
| JP | 10-115601 | 5/1998 |
| JP | 11-118773 | 4/1999 |
| JP | 11-235097 | 8/1999 |
| JP | 11-330185 | 11/1999 |
| JP | 2000-131243 | 5/2000 |

* cited by examiner

FIG. 2

| TABLE NUMBER | VARIABLE-LENGTH CODE TABLE | TABLE STRUCTURE | CLASS NUMBER |
|---|---|---|---|
| 0 | JPEG DC | FLIP-FLOP | 8 |
| 1 | JPEG DC | FLIP-FLOP | 10 |
| 2 | JPEG AC | FLIP-FLOP | 15 |
| 3 | JPEG AC | FLIP-FLOP | 15 |
| 4 | MPEG DC B.12 | HARD WIRED | 8 |
| 5 | MPEG DC B.13 | HARD WIRED | 9 |
| 6 | MPEG AC B.14 | HARD WIRED | 16 |
| 7 | MPEG AC B.15 | HARD WIRED | 20 |

FIG. 3

| COMPARATOR NUMBER <NUMBER OF BITS> | JPEG,MPEG DC CLASS NUMBER <CODE LENGTH> | MPEG B.14 CLASS NUMBER <CODE LENGTH> | MPEG B.15 CLASS NUMBER <CODE LENGTH> |
|---|---|---|---|
| 0 <17> | – | 0 <17> | 0 <17> |
| 1 <1> | 1 <1> | – | – |
| 2 <2> | 2 <2> | 14 <2> | – |
| 3 <3> | 3 <3> | 15 <3> | 15 <3> |
| 4 <4> | 4 <4> | 13 <4> | 13 <4> |
| 5 <5> | 5 <5> | 12 <5> | 14 <5> |
| 6 <6> | 6 <6> | 6 <6> | 8 <6> |
| 7 <7> | 7 <7> | 8 <7> | 10 <7> |
| 8 <8> | 8 <8> | 7 <8> | 9 <8> |
| 9 <9> | 9 <9> | 9 <9> | 11 <9> |
| 10 <10> | 10 <10> | 10 <6> | 5 <10> |
| 11 <11> | 11 <11> | 5 <11> | 6 <11> |
| 12 <12> | 12 <12> | 11 <6> | 7 <10> |
| 13 <13> | 13 <13> | 4 <13> | 4 <13> |
| 14 <14> | 14 <14> | 3 <14> | 3 <14> |
| 15 <15> | 15 <15> | 2 <15> | 2 <15> |
| 16 <16> | 16 <16> | 1 <16> | 1 <16> |
| 17 <6> | – | – | 12 <6> |
| 18 <4> | – | – | 16 <4> |
| 19 <6> | – | – | 17 <6> |
| 20 <8> | – | – | 18 <8> |
| 21 <9> | – | – | 19 <9> |

FIG. 4

| CLASS NUMBER | MINIMUM CODE WORD | CODE LENGTH |
| --- | --- | --- |
| 0 | 0000 0000 0001 0000 0 | 17 |
| 1 | 0000 0000 0010 0000 | 16 |
| 2 | 0000 0000 0100 000 | 15 |
| 3 | 0000 0000 1000 00 | 14 |
| 4 | 0000 0001 0000 0 | 13 |
| 5 | 0000 0010 000 | 11 |
| 6 | 0000 01 | 6 |
| 7 | 0000 1000 | 8 |
| 8 | 0001 000 | 7 |
| 9 | 0010 0000 0 | 9 |
| 10 | 0010 10 | 6 |
| 11 | 0011 00 | 6 |
| 12 | 0100 0 | 5 |
| 13 | 0110 | 4 |
| 14 | 10 | 2 |
| 15 | 110 | 3 |

FIG. 5

| CLASS NUMBER | MINIMUM CODE WORD | CODE LENGTH |
|---|---|---|
| 0 | 0000 0000 0001 0000 0 | 17 |
| 1 | 0000 0000 0010 0000 | 16 |
| 2 | 0000 0000 0100 000 | 15 |
| 3 | 0000 0000 1000 00 | 14 |
| 4 | 0000 0001 0000 0 | 13 |
| 5 | 0000 0010 00 | 10 |
| 6 | 0000 0011 000 | 11 |
| 7 | 0000 0011 10 | 10 |
| 8 | 0000 01 | 6 |
| 9 | 0000 1000 | 8 |
| 10 | 0001 000 | 7 |
| 11 | 0010 0000 0 | 9 |
| 12 | 0010 10 | 6 |
| 13 | 0100 | 4 |
| 14 | 0111 0 | 5 |
| 15 | 100 | 3 |
| 16 | 1100 | 4 |
| 17 | 1110 00 | 6 |
| 18 | 1111 0000 | 8 |
| 19 | 1111 1010 0 | 9 |

COMPONENT NUMBER 3

BLOCK NUMBER 5

COMPONENT NUMBER 2

BLOCK NUMBER 4

COMPONENT NUMBER 1

| BLOCK NUMBER 0 | BLOCK NUMBER 1 |
|---|---|
| BLOCK NUMBER 2 | BLOCK NUMBER 3 |

DECODING APPARATUS, METHOD, AND STORAGE MEDIUM FOR INPUTTING AND DECODING VARIABLE-LENGTH CODED DATA

FIELD OF THE INVENTION

The present invention relates to a decoding apparatus, a decoding method, a storage medium and program software for inputting coded data encoded by variable-length coding and decoding the input coded data.

BACKGROUND OF THE INVENTION

Conventionally, as a part of compression coding technique for still images and moving images, a method using an entropy coding technique by variable-length code is well known. This technique is also adopted in the JPEG (Joint Photographic Expert Group) coding and the MPEG (Moving Picture Expert Group) coding as international standards.

FIG. 12 is a block diagram showing an example of a variable-length decoding apparatus for the generally-used JPEG coding method as a still image coding method.

In FIG. 12, in coded data inputted in a shifter 1201, a variable-length code or additional bits are found-for access by each cycle. The coded data where the variable-length code/additional bits are found by each cycle is inputted into a comparator array 1203. In a current cycle, the coded data is compared with minimum code words of code lengths corresponding to variable-length code table of coded data inputted from a minimum code word & initial data memory 1202. The comparator array 1203 has comparators corresponding to the number of code lengths existing in the variable-length code table, and the bit lengths of the respective comparators respectively correspond to the existing code lengths. For example, if the variable-length code table has 16 types of code words of 1 to 16 bit code lengths, the number of comparators is 16. The respective comparators perform data-size comparison between the respective minimum code words with the input coded data in parallel. Each comparator outputs true (1) if the input coded data is greater than the minimum code word. The outputs from the comparator array 1203 are inputted into a priority encoder 1204 which assigns the highest priority to the output from the 1-bit comparator, and a highest priority comparator is obtained from the comparators which outputted comparison result as false (0).

In the JPEG coding, the number of bits of the comparator determined by the priority encoder 1204 becomes the code length, and is outputted via an MUX 1205 as a shift amount in the shifter 1201. Further, symbol data RRRR/SSSS (run/category) are stored, in the order of their occurrence, in a symbol memory 1207. Initial data corresponding to the code length as the output from the priority encoder 1204 is outputted from an MUX 1206, and added to the coded data as a frequency of occurrence. This becomes an address to the symbol memory 1207.

Note that the initial data is obtained by the following expression by each code length.

$$ADDR = VLCin - VLCmin + ADDRbase$$
$$= VLCin + (ADDRbase - VLCmin)$$

In the above expression, ADDR is an address in the symbol memory 1207; VLCin, coded data in which the variable-length code is currently found by the shifter 1201; VLCmin, a minimum code word in the same code length; and ADDRbase, an address of the minimum code length word in the symbol memory 1207. The right term (ADDRbase−VLCmin) corresponds to the initial data.

In the next cycle, the decoding symbol data RRRR and SSSS are outputted from the symbol memory 1207. The value of SSSS also becomes a shift amount of a right shifter 1208. Thus, the output data from the shifter 1201 where the additional bits are found is right-bit shift processed by the right shifter 1208, as output additional bits. As the value of SSSS equals the additional bit length, it is inputted as a shift amount into the shifter 1201, to shift out the additional bits.

FIG. 13 is a block diagram showing an example of a variable-length decoding apparatus for the MPEG1 or MEPG2 coding method generally-used as a moving image coding method. The variable-length decoding apparatus performs decoding processing on an Intra picture (I-Picture). In an Intra picture, image data is encoded by three types of variable-length coding methods, i.e., variable-length codings for DC and AC coefficients and fixed-length coding for AC coefficients.

The DC coefficient coding is very similar to the DC coefficient coding in the JPEG coding. A variable-length code which was found in a shifter 1301 is inputted into the DC decoder 1309. The DC decoder 1309 has a comparator array and a priority encoder as in the case of FIG. 12. At the same time, minimum code words of respective code lengths of a variable-length code table for Differential DC size are inputted into the comparator array from the minimum code word array 1308, and the input data are compared. The priority encoder obtains a code length from the comparison results, and an address to a table RAM 1310 holding the Differential DC sizes is generated. Thus, the obtained code length becomes a shift amount to a right shifter 1311. Then variable-length code of the next additional bits is obtained.

In the next cycle, the Differential DC size outputted from the table RAM 1310 is inputted as decoded data into a-selector 1312. Further, in the right shifter 1311, right-bit shift is performed with the Differential DC size value as a shift amount, and the data is inputted as additional bits into a selector 1312. In the figure, DC_SIZE indicates the Differential DC size; and DC_DIFF denotes additional bits.

On the other hand, in the case of AC coefficient coding, by RUN/LEVEL combination, input data is decoded by different decoding methods depending on whether the data is variable-length coded data or fixed-length coded data. If it is detected in the output from the shifter 1301 that the data is fixed-length coded data, an escape decoder 1306 decodes the data into RUN/LEVEL data. The escape decoder 1306 does not require a symbol memory, therefore it can be realized with a small-scale circuit construction.

On the other hand, in the case of variable-length coding, decoding processing is performed by using an AC coefficient symbol memory 1307. The coded data inputted from the shifter 1301 is compared with a variable-length code word stored in a variable-length code word and code length memory 1302 by a comparator 1303. The comparison processing is continued until coincidence of number of clocks is detected by each frequency of occurrence. If coincidence is detected in the comparator 1303, the number of clocks from the start of comparison to the current time is outputted from a decoder 1305 to an address counter 1304. This count value becomes the frequency of occurrence, and becomes an address to the AC symbol memory 1307. Further, in the cycle, the code length outputted from the variable-length code word and code length memory 1302 is outputted as a shift amount of the shifter 1301. In the next cycle, RUN/ LEVEL data is outputted from the AC coefficient symbol memory 1307 and inputted into a selector 1312. The selector 1312 selects an input signal in accordance with the variable- length coding method and outputs decoded data by the variable-length coding apparatus.

In recent years, there is an increasing need for a system capable of handling both still and moving images. In this case, a generally-used still-image decoding technique is the JPEG coding method as shown in FIG. 12, and a generally- used moving-image decoding technique is the MPEG cod- ing as shown in FIG. 13. It is possible to construct a decoding apparatus by using these constructions in FIGS. 12 and 13 in parallel, however, in such case, the apparatus requires a huge/enormous circuit scale. In addition, as a RAM, at least the symbol memory 1207 in FIG. 12, the DC coefficient DC_SIZE table 1310 and the AC coefficient symbol memory 1307 in FIG. 13 are respectively required. The necessary memory capacity increases, which increases the apparatus size, costs and the like.

SUMMARY OF THE INVENTION

The present invention has been made in view of the above-described conventional art, and has its object to provide a decoding apparatus which is a variable-length decoding apparatus corresponding to plural variable-length code tables, realized with a small-scale circuit construction, a decoding method and a storage medium.

Further, another object of the present invention is to provide a decoding apparatus which is a variable-length decoding apparatus corresponding to e.g. the JPEG coding and the MPEG coding methods, having a smaller circuit scale in comparison with a case where variable-length decoding apparatuses corresponding to the respective cod- ing methods are provided, a decoding method and a storage medium.

In order to attain the above described objects, a decoding apparatus of the present invention comprises the structure as follows.

A decoding apparatus of the present invention compris- ing: table storage means for storing, in correspondence with M types of variable-length code tables, M tables holding minimum code words or maximum code words of N classes of variable-length code words constructing a variable-length code table; table selection means for selecting a table from M tables in the table storage means; N comparison means for comparing input coded data with the minimum code words or maximum code words outputted from the table selected by the table selection means; class discrimination means for obtaining a class number corresponding to an initial code word of the input coded data based on results of comparison by the N comparison means; code length conversion means for converting the class number obtained by the class discrimination means into a code length; and address gen- eration means for generating an address to access a memory holding decoded data from the class number and the code length outputted from the code length conversion means.

In order to attain the above described objects, a decoding method of the present invention comprises the steps as follows. A decoding method for inputting and decoding variable-length coded data, comprises a table selection step of, in correspondence with M types of variable-length code tables, selecting one table corresponding to the variable- length coded data from M tables holding minimum code words or maximum code words of classes of variable-length code words constructing a variable-length code table; a comparison step of comparing input coded data with the minimum code words or maximum code words outputted from the table selected at the table selection step by using N comparators; a class discrimination step of obtaining a class number corresponding to an initial code word of the input coded data based on results of comparison by the N com- parators; a code length conversion step of converting the class number into a code length; and a step of accessing a memory holding decoded data, from the class number and the code length obtained at the code length conversion step, and obtaining decoded data.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodi- ments of the invention and, together with the description, serve to explain the principles of the invention.

FIG. 2 is a diagram showing correspondence between tables and variable-length code tables used in the first embodiment;

FIG. 3 is a diagram showing correspondence among respective tables, class numbers and comparators;

FIG. 4 is a diagram showing correspondence among class numbers, minimum code words and code lengths in MPEG B. 14;

FIG. 5 is a diagram showing correspondence among class numbers, minimum code words and code lengths in MPEG B. 15;

FIGS. 7A to 7C are schematic diagrams showing examples of a JPEG coding MCU;

DETAILED DESCRIPTION OF THE PREFERRED EMBODIMENTS

Hereinbelow, preferred embodiments of the present invention will be described in detail with reference to the attached drawings.

[First Embodiment]

Figure 1:
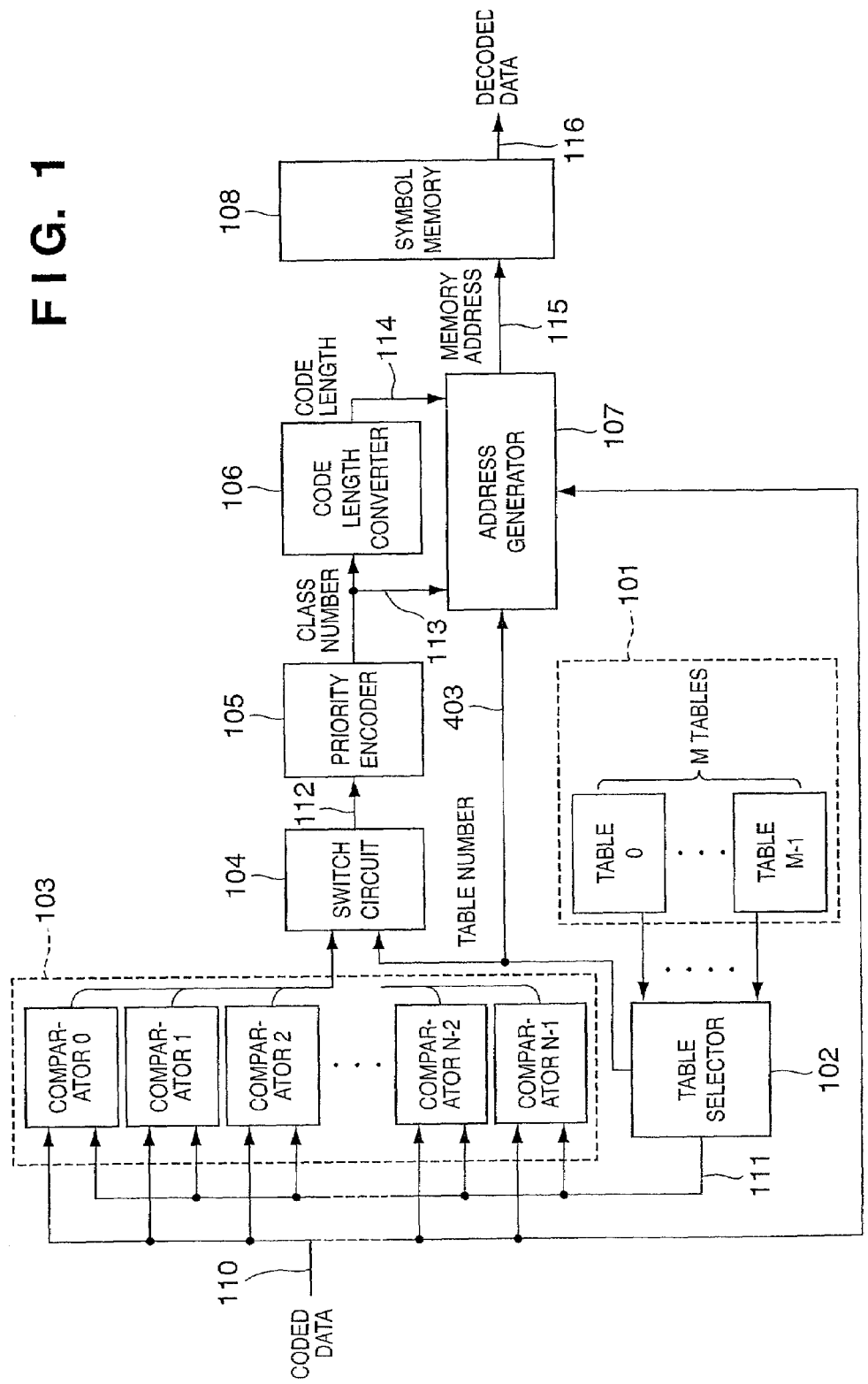
FIG. 1 is a block diagram showing the construction of a variable-length image decoding apparatus according to a first embodiment of the present invention.

FIG. 1 is a block diagram showing the construction of an image decoding apparatus according to a first embodiment of the present invention. The decoding apparatus performs decoding processing on an Intra picture obtained by the JPEG coding, MPEG1 coding or MPEG2 coding. FIG. 1 shows an example of a variable-length decoding apparatus where the value of M is "8", and N is "22".

First, classes of variable-length code tables will be described.

In the present embodiment, 8 (=M) variable-length code tables are prepared. Among these tables, 4 tables are constructed with e.g. flip-flops for the JPEG coding method, and the other 4 tables are constructed as hard-wired fixed value tables for the MPEG coding methods.

That is, in this embodiment, as an example of JPEG coding variable-length code tables, Table K.3 shown in ISO/IEC 10918-1 Annex K is used as a table 0; Table K.4, as a table 1; Table K.5, as a table 2; and Table K.6, as a table 3.

On the other hand, in the MPEG coding methods, Table B.12 in ISO/IEC 13818-2 Annex B is used as a table 4; Table B.13, as a table 5; Table B.14, as a table 6; and Table B.15, as a table 7, as hard-wired tables.

In FIG. 1, reference numeral 101 denotes a variable-length code table having M (=8) tables (0 to 7). Numeral 102 denotes a table selector which inputs a coding method, a component number, a DC coefficient and the like inputted from the outside, selects a table to be used and outputs minimum code word group of the selected table to a comparator group 103. Further, the table selector 102 notifies a switch circuit 104 and an address generator 107 of table number of the selected table by a signal 403. The comparator group 103 has N (=22) comparators. The comparator group 103 compares minimum code words 111 supplied from the table selector 102 with input coded data 110, and outputs the results of comparison to the switch circuit 104.

The switch circuit 104 inputs the results of comparison outputted from the N comparators 0 to (N−1), and outputs a class number 112 based on the results of comparison in comparators corresponding to the selected table number (signal 403). A priority encoder 105 inputs the class number 112, selects a minimum numbered class number 113 and outputs it. A code length converter 106 inputs the selected class number 113, and outputs a code length 114 in accordance with a table in FIG. 3 to be described later. Numeral 107 denotes an address generator which inputs the coded data 110, the table number 403, the class number 113 and the code length 114, and generates an address 115 to a symbol memory 108 based on these input data. Symbol data RRRR/SSSS (run/category) are stored in the order of frequency of occurrence in the symbol memory 108. Accordingly, data 116 read from a memory address accessed in accordance with the address 115 from the address generator 107 is the result of decoding the input coded data 110.

FIG. 2 shows an example of table numbers of the variable-length code table 101 and class numbers corresponding to the respective variable-length code tables.

In the variable-length code tables of the tables 0 to 5, the class number is equal to the number of types of code lengths existing in the variable-length code table. For example, the table 0 has 2 to 9 bit code lengths, and a class number "8". Note that in the tables 6 and 7, the class number does not correspond with the number of code length types, since the type of the variable-length code tables does not correspond to the JPEG coding and MPEG coding for DC coefficient, and upon group classification-by the same code length, the values of the code words are not continuous.

FIG. 3 shows the relation between the class numbers of the respective variable-length code tables and the numbers of the comparators.

As shown in column 310 of FIG. 3, in the tables 0 to 5 (for JPEG DC, JPEG AC, MPEG DC B.12 and B.13, see FIG. 2), the class number corresponds with the comparator number used in the class and the number of bits of the comparator.

On the other hand, regarding the tables 6 and 7 (for MPEG AC B.14 and B.15, see FIG. 2) in columns 311 and 312, as shown in FIGS. 4 and 5, a group of continuous code lengths are divided into classes, and the respective comparators are allocated to the respective class numbers as shown in FIG. 3.

FIG. 4 shows the relation between the minimum code words of the respective class numbers and their code lengths in MPEG B.14 (table 6).

Further, FIG. 5 shows the relation between the minimum code words of the respective class numbers and their code lengths in MPEG B.15 (table 7).

Figure 6:
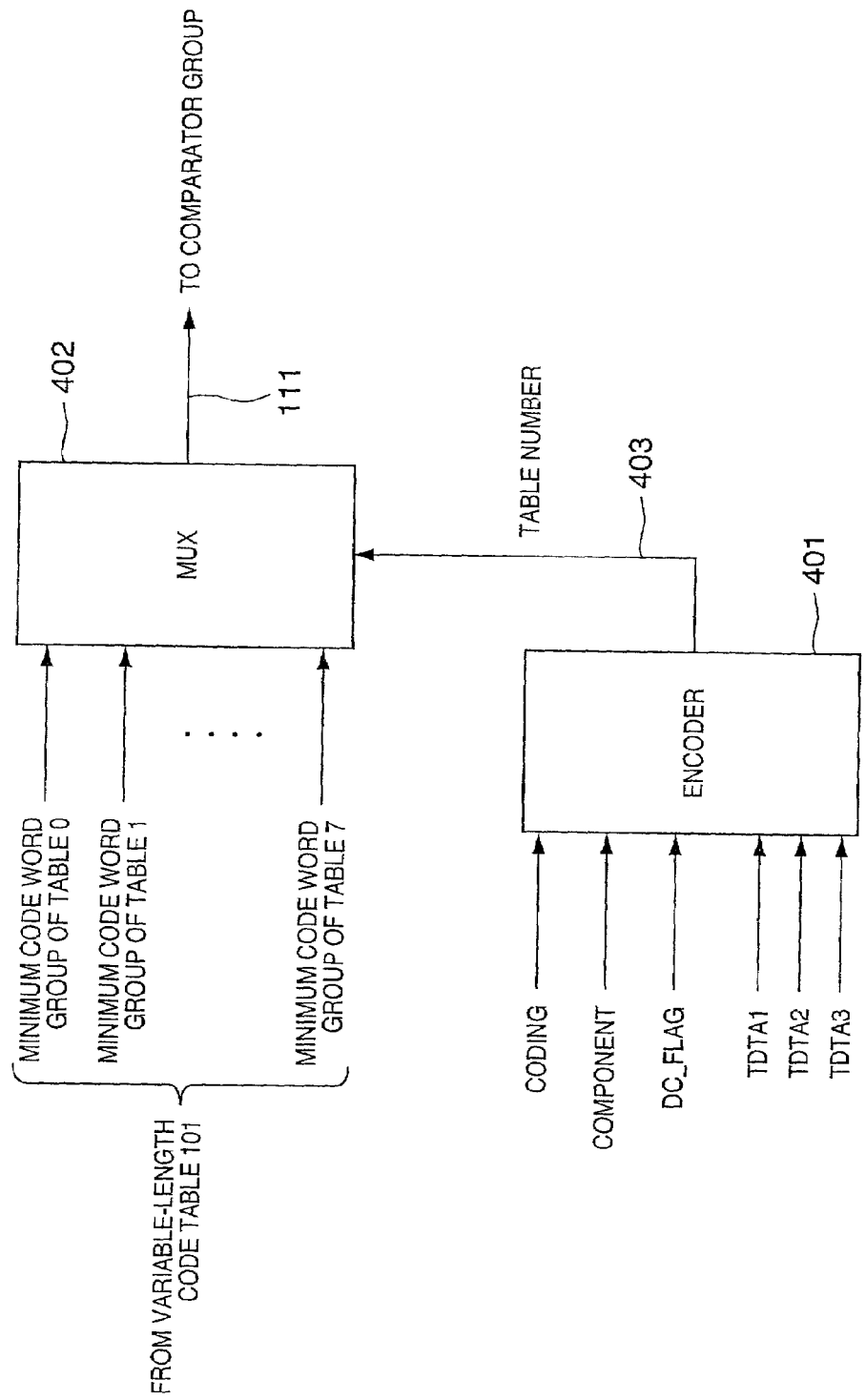
FIG. 6 is a block diagram showing the construction of a table selector according to the first embodiment.

FIG. 6 is a block diagram showing the construction of the table selector 102 according to the present embodiment.

In this example, for explaining the table selector 102, image data to be subjected to decoding processing is coded data obtained by the JPEG coding, and is constructed with three Y, Cb and Cr components, and further, sub-sampling ratio is "4-2-0".

FIGS. 7A to 7C show the construction of the minimum coding unit (MCU) at this time.

In FIG. 6, a CODING signal indicates a coding method, and a value indicating the JPEG coding method is inputted. Further, a component number in FIGS. 7A to 7C is inputted as a COMPONENT signal. A value indicating whether the data is a DC coefficient or not is inputted as a DC_FLAG signal. Further, TDTA1 to TDTA3 respectively correspond to component numbers 1 to 3 in FIGS. 7A to 7C, and indicate whether DC coefficients of the respective components are encoded by any one of the variable-length code tables 0 to 1, or AC coefficients are encoded by any one of the variable-length code tables 2 and 3. One of the tables 0 to 7 is selected by an encoder 401 based on these input signals, and the signal indicating the selected table number is supplied to an MUX 402. Then the MUX 402 selects a minimum code group of table corresponding to the input table number 403 and outputs it to the comparator group 103.

Next, the comparator group 103 will be described. As shown in FIG. 3, the comparator group 103 has 22 comparators 0 to 21. The bit widths of the respective comparators are as shown in FIG. 3. Each comparator outputs "1" if the input coded data 110 is greater than the minimum code word. Note that if the table 6 (for MPEG AC B.14) is selected, the comparator 10 (10 bits) performs AND operation between the lower-order 4 bits and "0" to obtain 6 bits, further, the comparator 12 (12 bits) performs AND operation between the lower-order 6 bits and "0" to obtain 6 bits (See 300 and 301 in FIG. 3). If the table 7 (for MPEG AC B.15) is selected, the comparator 12 (12 bits) performs AND operation between the lower-order 2 bits of the coded data 110 and "0" to obtain 10 bits (see 302 in FIG. 3).

Figure 8:
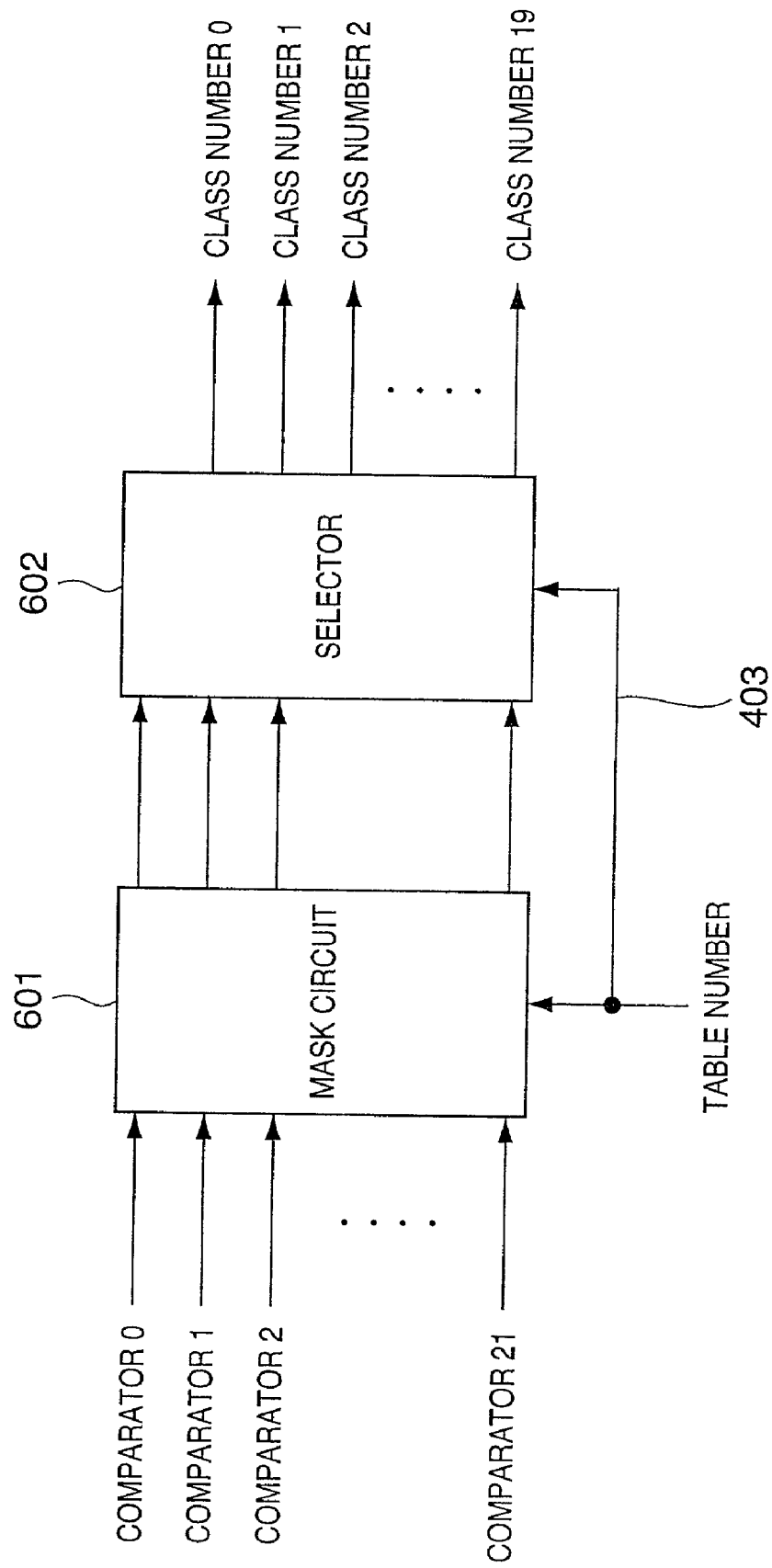
FIG. 8 is a block diagram showing the construction of a switch circuit according to the first embodiment.

FIG. 8 is a block diagram showing the construction of the switch circuit 104 according to the present embodiment.

The switch circuit 104 inputs 22 signal lines indicating the results of comparison from the 22 comparators of the comparator group 103 in parallel. A mask circuit 601 performs AND operation between the respective signals on these 22 signal lines and "0" or "1" in accordance with the currently-selected table number (signal 403). For example, if the table 6 (for MPEG AC B.14) is selected, AND operation is performed between the output signals from the comparator 1 and the comparators 17 to 21 and "0" (since the outputs from these comparators are unnecessary as shown in column 311 of in FIG. 3), and AND operation is performed between the other outputs and "1". Similarly, if the table 7 (for MPEG AC B.15) is selected, AND operation is performed between the output signals from the comparators 1 and 2 and "0" (see column 312 in FIG. 3). The outputs from the mask circuit 601 are inputted into the selector 602, which outputs the results of comparison by the respective comparators as class numbers, as shown in FIG. 3 in accordance with the signal 403 indicating the table number.

In FIG. 1, the priority encoder 105 inputs the output signals (class numbers) from the selector 602 in FIG. 8 in parallel, and detects class numbers of "1" signal. As the priority order upon detection, the class number 0 is the highest priority number; the class number 1 is the next higher priority number; the class number 2 is the next priority number. In this manner, the priority becomes lower in the ascending numeric order, and the class number 19 is the lowest priority number.

The code length converter 106 inputs the class number 113 detected by the priority encoder 105. If any one of the tables 0 to 5 (for JPEG DC, JPEG AC, MPEG DC B.12 and B.13) are selected, the code length converter 106 outputs the class number without conversion, as the code length 114 (see FIG. 3). If the table 6 or 7 (for MPEG AC B.14 and B.15) is selected, the class number is converted to the code length 114 in accordance with FIG. 3.

Figure 9:
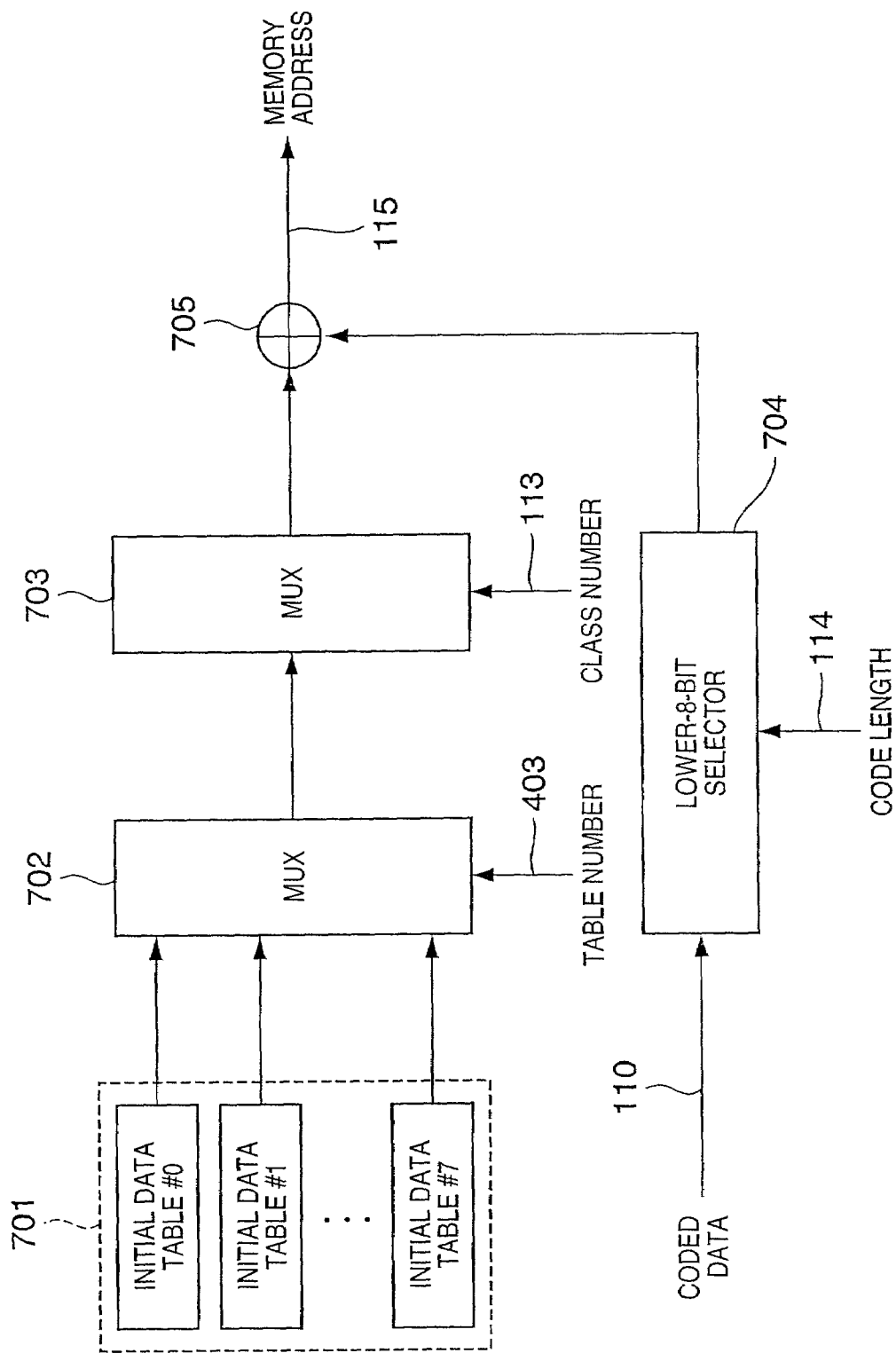
FIG. 9 is a block diagram showing the construction of an address generator according to the first embodiment.

FIG. 9 is a block diagram showing the construction of the address generator 107 according to the present embodiment.

In FIG. 9, an initial data table 701 has initial data tables 0 to 7 respectively corresponding to the variable-length code tables. The 8 initial data tables 0 to 7 hold minimum code words of classes of the corresponding variable-length code tables. The initial data tables 0 to 3 corresponding to the JPEG coding method are constructed with flip-flops, and the initial data tables 4 to 7 corresponding to the MPEG coding methods are hard-wired tables.

An MUX 702 selects one of the initial data tables 0 to 7, in accordance with the signal 403 indicating the table number inputted from the table selector 102, and outputs it to an MUX 703. The MUX 703 inputs the class number 113 from the priority encoder 105, and selects a minimum code word corresponding to the class number 113 and outputs it to an adder 705.

On the other hand, a lower-8-bit selector 704 selects lower-order 8 bits of the code word from the coded data 110. Note that if the code length 114 is less than 8 bits, the higher-order bit is padded with "0". Then, the adder 705 adds the output from the MUX 703 to the lower-order 8 bit code word from the lower-8-bit selector 704, and outputs the added result as a memory address 115 of the symbol memory 108.

Figure 10:
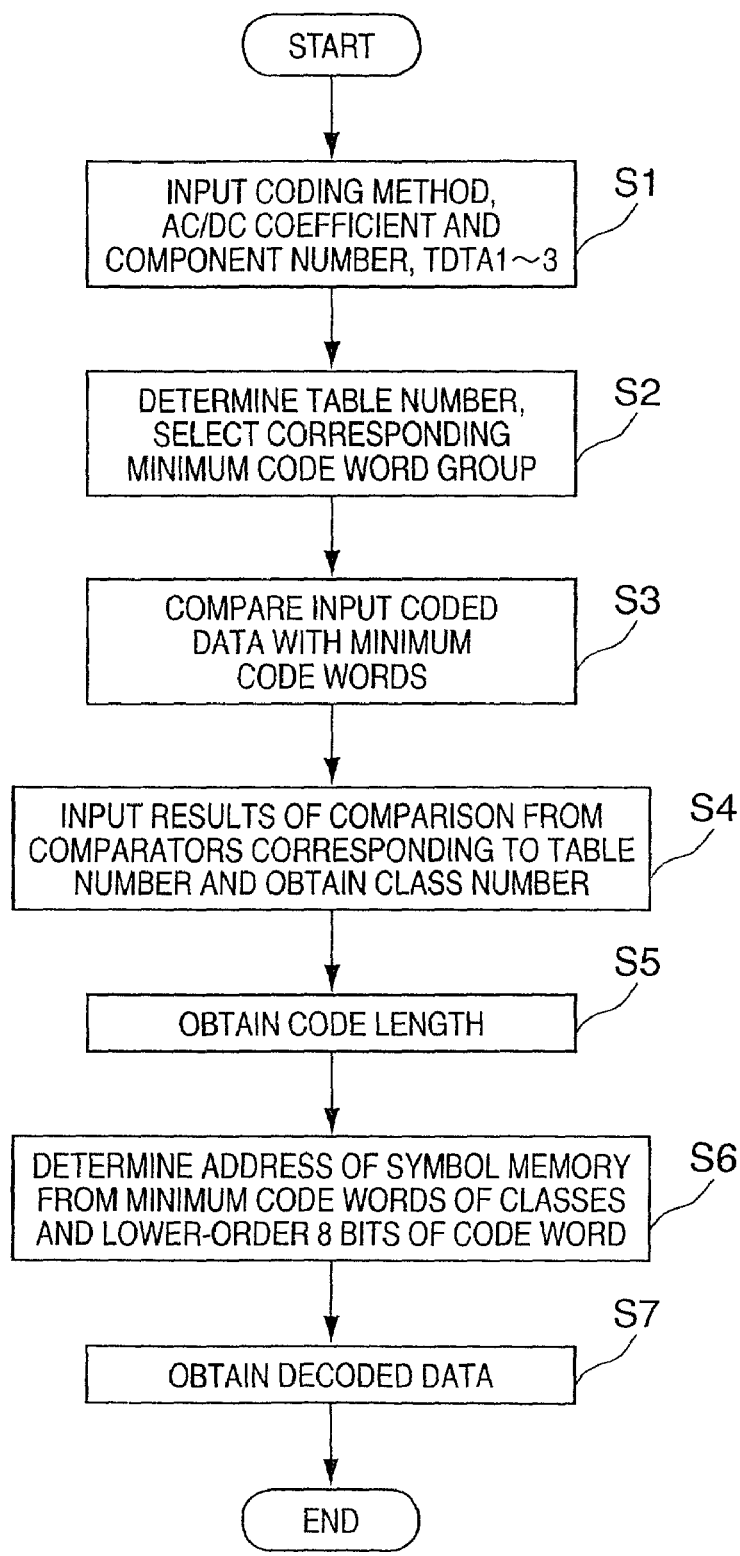
FIG. 10 is a flowchart showing processing in the variable- length image decoding apparatus according to the first embodiment.

FIG. 10 is a flowchart for explaining decoding processing in the decoding apparatus according to the first embodiment.

In the figure, first, at step S1, the coding method indicated by the above-described CODING signal, the component number indicated by the COMPONENT signal and data (TDTA1–TDTA3) indicating the variable-length code table used in coding of the DC or AC component of each component, are inputted. Next, at step S2, the table number of the variable-length code table 101 is determined based on these input data, and corresponding minimum code words are selected. Then at step S3, the selected minimum code words 111 are compared with the input coded data 110. Next, at step S4, the class number 113 is obtained based on the results of comparison. Then at step S5, the code length 114 is obtained based on the class number 113 and the selected table number 403. Then at step S6, the address 115 of the symbol memory 108 is generated from the minimum code word of the class and the lower-order 8 bits of the code word. Then at step S7, the symbol memory 108 is accessed based on the address 115, and decoded data 116 corresponding to the input coded data 110 is obtained.

As described above, the decoding apparatus according to the first embodiment decodes a variable-length code word of any of still image and moving image without increase in circuit scale.

[Second Embodiment]

Next, a second embodiment of the present invention will be described with reference FIG. 11 as an example of variable-length decoding system using the variable-length decoding apparatus of the above-described first embodiment.

The variable-length decoding system according to the second embodiment performs decoding processing on an Intra picture encoded by the JPEG coding method, the MPEG1 or MPEG2 coding method.

Figure 11:
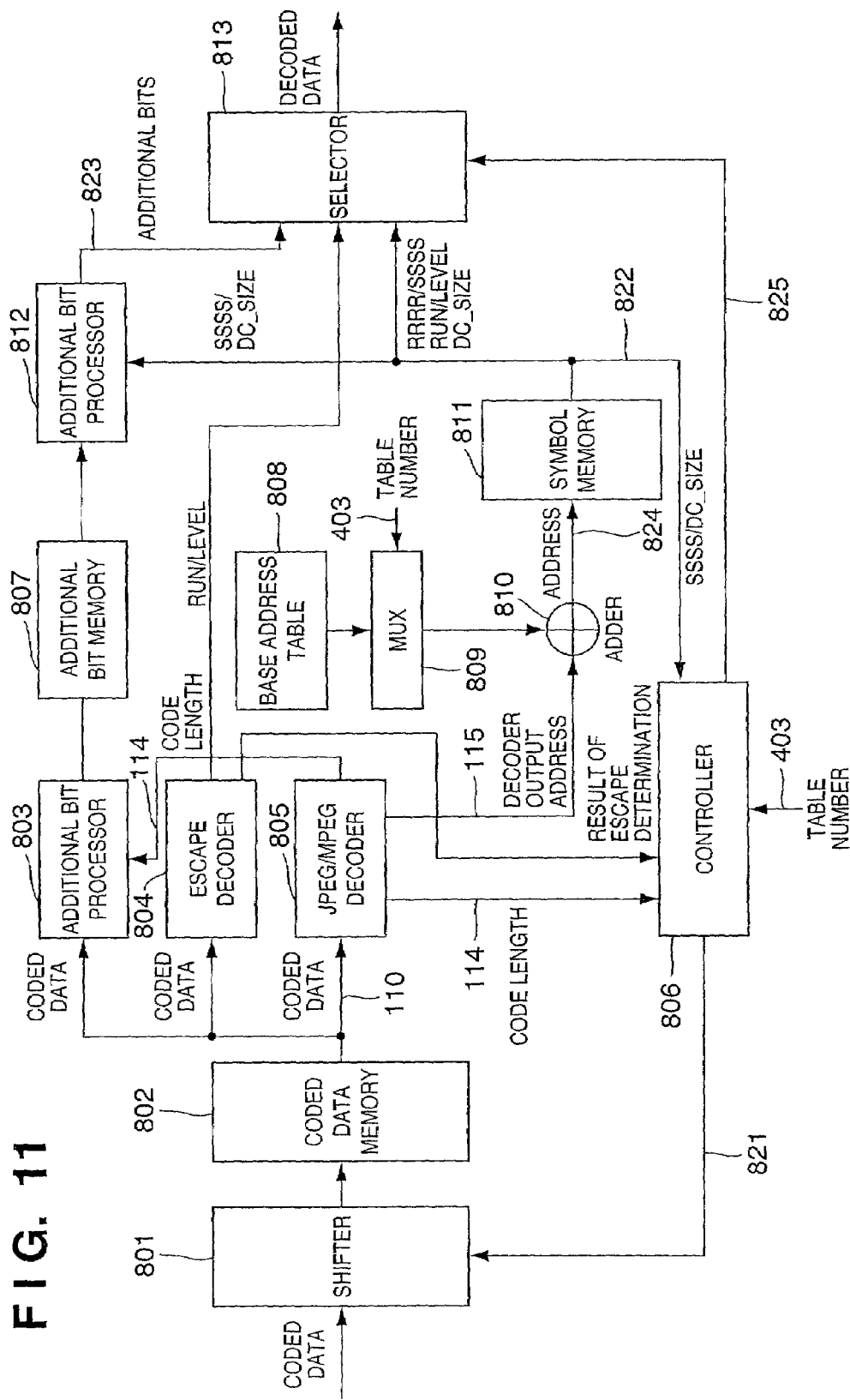
FIG. 11 is a block diagram showing the configuration of a variable-length image decoding system according to a second embodiment of the present invention.
Figure 12:
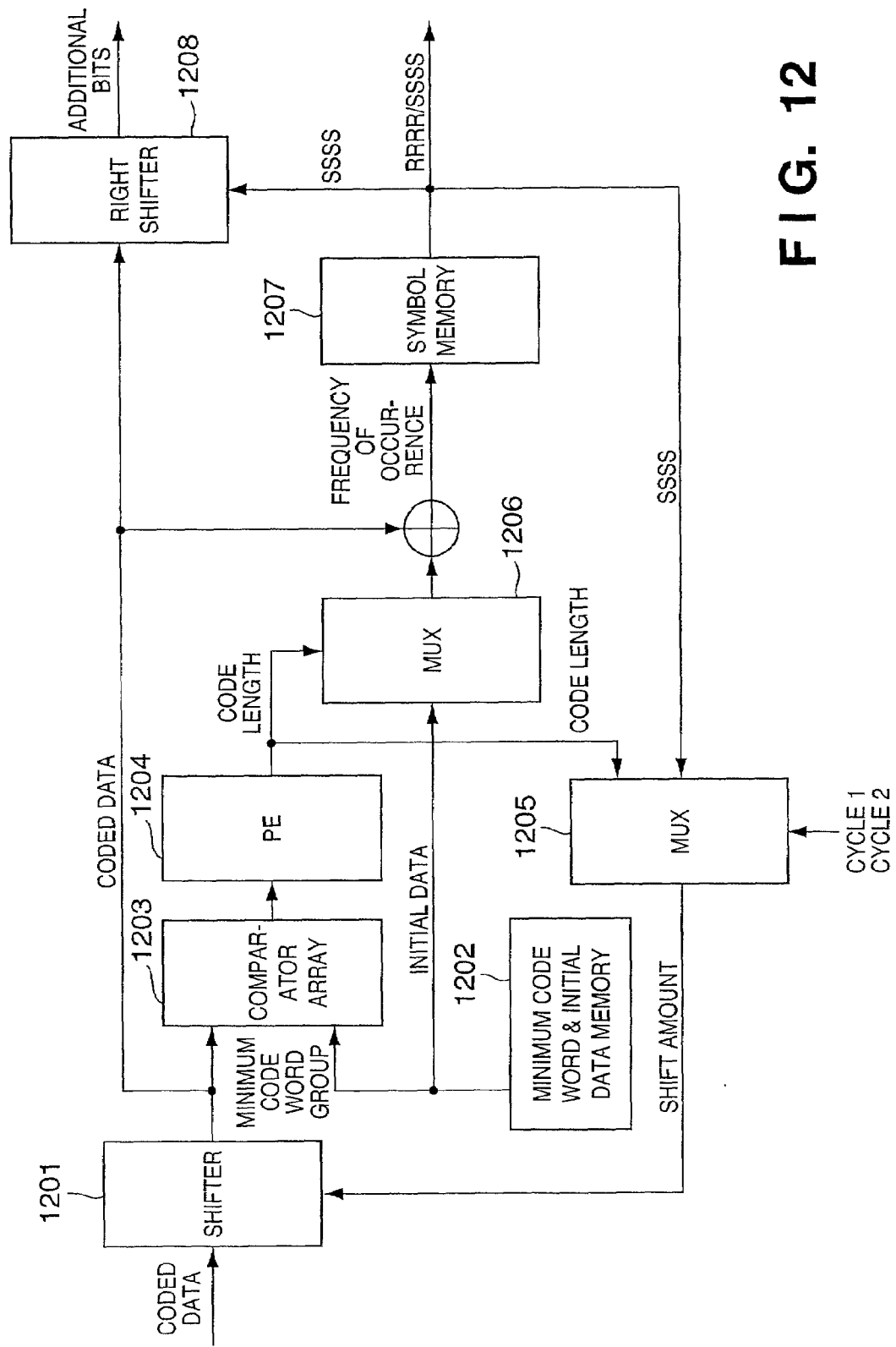
FIG. 12 is a block diagram showing the construction of a variable-length decoding apparatus corresponding to the JPEG coding method utilizing the conventional technique.
Figure 13:
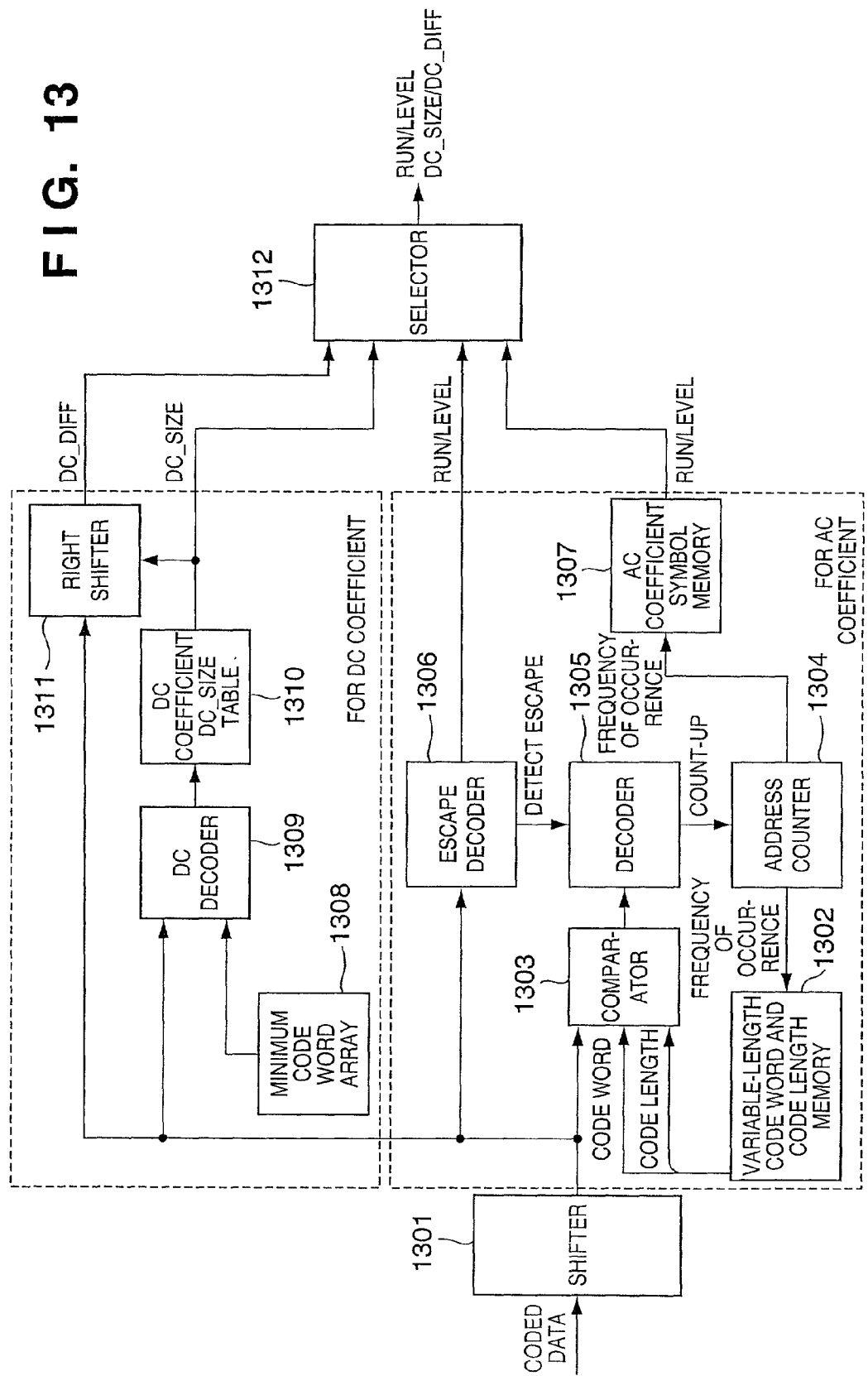
FIG. 13 is a block diagram showing the construction of a variable-length decoding apparatus corresponding to the MPEG coding method utilizing the conventional technique.

In FIG. 11, a JPEG/MPEG decoder 805 corresponds to the variable-length decoding apparatus (FIG. 1) of the first embodiment, and has the same construction as that of the table group 101 (FIG. 1) in use of the variable-length code table of the first embodiment.

In FIG. 11, in the input coded data, the code word or additional bits are found by a shifter 801. The shift operation is performed based on a shift amount 821 inputted from a controller 806. The coded data in which the code word or additional bits were found, is latched by a coded data memory 802 in synchronization with a clock.

As shown in the above-described first embodiment, the JPEG/MPEG decoder 805 outputs the code length 114 and the address 115 to the symbol memory 811.

Further, an escape decoder 804 connected in parallel to the JPEG/MPEG decoder 805 is a block for decoding only fixed length code when the tables 6 and 7 are selected. The escape decoder 804 outputs data indicating whether or not the coded data 110 inputted from the coded data memory 802 is fixed-length code data (escape determination result) to the controller 806, and outputs RUN and LEVEL as decoded data to a selector 813.

An additional bit processor 803 and an additional bit processor 812 are used only when the tables 0 to 5 are selected. The additional bit processor 803 performs left bit shift processing with the code length 114 inputted from the JPEG/MPEG decoder 805 as a shift amount. The result of processing is latched in an additional bit memory 807 in synchronization with the clock. On the other hand, the additional bit processor 812 performs right bit shift processing on data inputted from the additional bit memory 807 with symbol data 822 outputted from the symbol memory 811 as a shift amount, and outputs the result of processing as an additional bit 823 to the selector 813.

Symbol data corresponding to the necessary variable-length code tables are stored in the symbol memory 811. For example, data based on the JPEG coding method and data based on the MPEG coding method cannot be mixed as the same coded data, therefore, the symbol data corresponding to the tables 0 to 3 are stored for the JPEG coding method, and the symbol data corresponding to the tables 4 to 7 are stored for the MPEG coding method. Further, the symbol data corresponding to plural variable-length codes are stored in the symbol memory 811. For this purpose, top addresses, where the symbol data of the respective variable-length code tables are stored, are stored in a base address table 808. A top address is selected from the base address table 808 in correspondence with the currently-selected table number (403), and added to the address 115 outputted from the JPEG/MPEG decoder 805 by the adder 810, as an address 824 to the symbol memory 811.

The controller 806 outputs the shift amount 821 to the shifter 801 and a selection signal 825 to the selector 813. The shift amount 821 to the shifter 801 in the case of the JPEG coding method is different from that in the case of the MPEG coding method. In the JPEG coding method, in an initial cycle, the code length 114 inputted from the JPEG/MPEG decoder 805 is stored into flip-flops (not shown), and in the next cycle, the symbol data 822 inputted from the symbol memory 811 is added to the code length 114 stored in the previous cycle, as the shift amount 821. This operation is repeated.

On the other hand, in the MPEG coding method, if the tables 4 and 5 are selected, an operation similar to that in the JPEG coding method is performed, and if the tables 6 and 7 are selected, the code length 114 outputted from the JPEG/MPEG decoder 805 is outputted as the shift amount 821 by each clock, since in the MPEG coding for AC coefficients, additional bits do not exist. Note that if it is detected in the escape decoder 804 that the data is fixed-length code data, the number of bits (code length) of the fixed length code is outputted as the shift amount 821.

Thus the controller 806 controls the shift amount for the shifter 801. Further, if the data is fixed-length code data when the tables 6 and 7 are selected, the controller 806 selects the output from the escape decoder 804 by the selector 813, based on the result of determination from the escape decoder 804. On the other hand, when the tables 0 to 5 are selected, the controller 806 selects the output from the additional bit processor 812 and the symbol data 822 by the selector 813.

The present invention can be applied to a system constituted by a plurality of devices (e.g., a host computer, an interface, a reader and a printer) or to an apparatus comprising a single device (e.g., a copy machine or a facsimile apparatus).

Further, the object of the present invention can be also achieved by providing a storage medium (or recording medium) storing software program code for realizing the functions according to the above-described embodiments to a system or an apparatus, reading the program code with a computer (e.g., CPU, MPU) of the system or apparatus from the storage medium, then executing the program. In this case, the program code itself read from the storage medium realizes the functions according to the embodiments, and the storage medium storing the program code constitutes the invention. Further, besides aforesaid functions according to the above embodiments are realized by executing the program code which is read by a computer, the present invention includes a case where an operating system (OS) or the like working on the computer performs a part or entire actual processing in accordance with designations of the program code and realizes functions according to the above embodiments.

Furthermore, the present invention also includes a case where, after the program code read from the storage medium is written in a function expansion card which is inserted into the computer or in a memory provided in a function expansion unit which is connected to the computer, a CPU or the like contained in the function expansion card or unit performs a part or entire actual processing in accordance with designations of the program code and realizes the functions according to the above embodiments.

As described above, according to the present embodiments, a variable-length decoding apparatus corresponding to plural variable-length code tables can be realized with a small-scale circuit construction.

Further, according to the present embodiments, one variable-length decoding apparatus handles plural coding methods (e.g., the JPEG coding method and the MPEG coding method). The circuit scale of the apparatus is smaller in comparison with a case where variable-length decoding apparatuses are provided respectively for the plural coding methods, and further, the necessary memory capacity is reduced.

The present invention is not limited to the above embodiments and various changes and modifications can be made within the spirit and scope of the present invention. Therefore, to appraise the public of the scope of the present invention, the following claims are made.

What is claimed is:

1. A decoding apparatus comprising:
    table storage means for storing, in correspondence with M types of variable-length code tables, M tables holding minimum code words or maximum code words of N classes of variable-length code words constructing a variable-length code table;
    table selection means for selecting a table from the M tables in said table storage means;
    N comparison means for comparing input coded data with the minimum code words or maximum code words outputted from the table selected by said table selection means;
    class discrimination means for obtaining a class number corresponding to an initial code word of the input coded data based on results of comparison by said N comparison means;
    code length conversion means for converting the class number obtained by said class discrimination means into a code length; and
    address generation means for generating an address to access a memory holding decoded data from the class number and the code length outputted from said code length conversion means.

2. The decoding apparatus according to claim 1, wherein said table selection means selects the table based on at least a coding method of the input coded data, a component number and data indicating a variable-length code table used upon coding.

3. The decoding apparatus according to claim 1, wherein said class discrimination means selects the results of comparison by said N comparison means based on a number of the table selected by said table selection means, and determines a minimum class number among class numbers corresponding to said comparison means of the selected results of comparison, as the class number.

4. The decoding apparatus according to claim 1, wherein said code-length conversion means converts the class number into the code length based on the class number obtained by said class discrimination means and a number of the table selected by said table selection means.

5. The decoding apparatus according to claim 1, wherein the M tables include a RAM, a ROM or a table constructed with flip-flops.

6. The decoding apparatus according to claim 1, wherein the class number N stored in each of the M tables is set to an arbitrary value.

7. The decoding apparatus according to claim 1, wherein the maximum code words or minimum code words stored in the M tables correspond to the JPEG coding method and the MPEG coding method.

8. A decoding method for inputting and decoding variable-length coded data, comprising:
  a table selection step, of, in correspondence with M types of variable-length code tables, selecting one table corresponding to the variable-length coded data from M tables holding minimum code words or maximum code words of classes of variable-length code words constructing a variable-length code table;
  a comparison step, of comparing input coded data with the minimum code words or maximum code words outputted from the table selected in said table selection step by using N comparators;
  a class discrimination step, of obtaining a class number corresponding to an initial code word of the input coded data based on results of comparison by the N comparators;
  a code length conversion step, of converting the class number into a code length; and
  a step, of accessing a memory holding decoded data, from the class number and the code length obtained in said code length conversion step, and obtaining decoded data.

9. The decoding method according to claim 8, wherein in said class discrimination step, the results of comparison by the N comparators is selected based on a number of the table selected in said table selection step, and a minimum class number among class numbers corresponding to comparators of the selected results of comparison is determined as the class number.

10. The decoding method according to claim 8, wherein in said code-length conversion step, the class number is converted into the code length based on the class number obtained in said class discrimination step and the number of the table selected in said table selection step.

11. The decoding method according to claim 8, wherein in said table selection step, the table is selected based on at least a coding method of the input coded data, a component number and data indicating a variable-length code table used upon coding.

12. The decoding method according to claim 8, wherein the M tables include a RAM, a ROM or a table constructed with flip-flops.

13. The decoding method according to claim 8, wherein the class number N stored in each of the M tables is set to an arbitrary value.

14. The decoding method according to claim 8, wherein the maximum code words or minimum code words stored in the M tables correspond to the JPEG coding method and the MPEG coding method.

15. A computer-readable storage medium holding a program for executing a decoding method for inputting and decoding variable-length coded data, having:
  a table selection process module, adapted to, in correspondence with M types of variable-length code tables, select one table corresponding to the variable-length coded data from M tables holding minimum code words or maximum code words of classes of variable-length code words constructing a variable-length code table;
  a comparison process module, adapted to compare input coded data with the minimum code words or maximum code words outputted from the table selected at said table selection process module;
  a class discrimination module, adapted to obtain a class number corresponding to an initial code word of the input coded data based on results of comparison at said comparison module;
  a code length conversion module, adapted to convert the class number into a code length; and
  a module, adapted to access a memory holding decoded data, from the class number and the code length obtained at said code length conversion module, and obtain decoded data.

16. The storage medium according to claim 15, wherein at said table selection module, the table is selected based on at least a coding method of the input code data, a component number and data indicating a variable-length code table used upon coding.

17. The storage medium according to claim 15, wherein the M tables include a RAM, a ROM or a table constructed with flip-flops.

18. The storage medium according to claim 15, wherein the class number N stored in the respective M tables is set to an arbitrary value for the respective tables.

19. The storage medium according to claim 15, wherein the maximum code words or minimum code words stored in the M tables correspond to the JPEG coding method and the MPEG coding method.

* * * * *

UNITED STATES PATENT AND TRADEMARK OFFICE
CERTIFICATE OF CORRECTION

PATENT NO. : 6,993,202 B2
APPLICATION NO. : 10/082280
DATED : January 31, 2006
INVENTOR(S) : Susumu Igarashi et al.

It is certified that error appears in the above-identified patent and that said Letters Patent is hereby corrected as shown below:

On Title Page Item (56)

"     FOREIGN PATENT DOCUMENTS     " should be deleted.

JP      7-35732      4/1995

(Continued)

OTHER PUBLICATIONS

T. Ikeda et al, "Development of the Ultrasonic Degradation Tester for Low Voltage Cables", Transactions of the Institute of Electrical Engineers of Japan, vol. 120-B, No. 11, pp. 1437-1442, 2000.

PAGE 2, Title page

"     FOREIGN PATENT DOCUMENTS     " should be deleted.

| | | |
|---|---|---|
| JP | 7-245869 | 9/1995 |
| JP | 9-222393 | 8/1997 |
| JP | 10-19856 | 1/1998 |
| JP | 10-115601 | 5/1998 |
| JP | 11-118773 | 4/1999 |
| JP | 11-235097 | 8/1999 |
| JP | 11-330185 | 11/1999 |
| JP | 2000-131243 | 5/2000 |

* cited by examiner

On Title Page, Item (57) ABSTRACT

Line 15, "outputted" should read --outputted from--.

COLUMN 1

Line 25, "found-for" should read --found for--;
Line 30, "to" should read --to a--; and
Line 31, "&" should read --and--.

UNITED STATES PATENT AND TRADEMARK OFFICE
CERTIFICATE OF CORRECTION

PATENT NO. : 6,993,202 B2
APPLICATION NO. : 10/082280
DATED : January 31, 2006
INVENTOR(S) : Susumu Igarashi et al.

It is certified that error appears in the above-identified patent and that said Letters Patent is hereby corrected as shown below:

COLUMN 2

Line 16, "generally-used" should read --generally used--.

COLUMN 6

Line 1, "classification-by" should read --classification by--; and
Line 45, "of" should read --of the--.

COLUMN 9

Line 56, "besides" should read --besides the fact that the--.

Signed and Sealed this

Fourteenth Day of November, 2006

JON W. DUDAS
*Director of the United States Patent and Trademark Office*